(12) United States Patent
Mori

(10) Patent No.: US 6,367,149 B1
(45) Date of Patent: Apr. 9, 2002

(54) METHOD OF ASSEMBLING AN IC SOCKET FOR INTERCONNECTING ARTICLES WITH DIFFERENT TERMINAL PITCHES

(75) Inventor: Kentaro Mori, Kawaguchi (JP)

(73) Assignee: Enplas Corporation, Saitama-Ken (JP)

( * ) Notice: Subject to any disclaimer, the term of this patent is extended or adjusted under 35 U.S.C. 154(b) by 0 days.

(21) Appl. No.: 09/203,795

(22) Filed: Dec. 1, 1998

(30) Foreign Application Priority Data

Dec. 2, 1997 (JP) ............................................. 9-346988

(51) Int. Cl.[7] ................................................. H05K 3/30
(52) U.S. Cl. ............................. 29/837; 29/838; 29/832; 29/741; 29/759; 439/67; 439/74
(58) Field of Search .......................... 29/876, 847, 882, 29/883, 884, 741, 759, 760, 832, 837, 838; 439/67, 77, 85, 74

(56) References Cited

U.S. PATENT DOCUMENTS 5,343,616 A * 9/1994 Boberts ........................ 29/846

5,508,628 A * 4/1996 Pfaff ............................ 29/847

FOREIGN PATENT DOCUMENTS

JP 4-163876 A * 6/1992 ........... H01R/33/76

* cited by examiner

Primary Examiner—S. Thomas Hughes
Assistant Examiner—Rick Kiltae Chang
(74) Attorney, Agent, or Firm—Fish & Richardson PC

(57) ABSTRACT

An IC socket adapted to establish an electrical connection between an IC package and a printed board includes a socket body having a mount portion on which the IC package is mounted, a number of contact pins disposed on the socket body in substantially equally adjacent arrangement, each of the contact pins having one end to be connected to a terminal of the IC package and another end to be connected to the printed board, and an interval widening member provided for the socket body for widening a pitch interval between the other ends of adjacent contact pins so as to provide a predetermined distance therebetween.

6 Claims, 11 Drawing Sheets

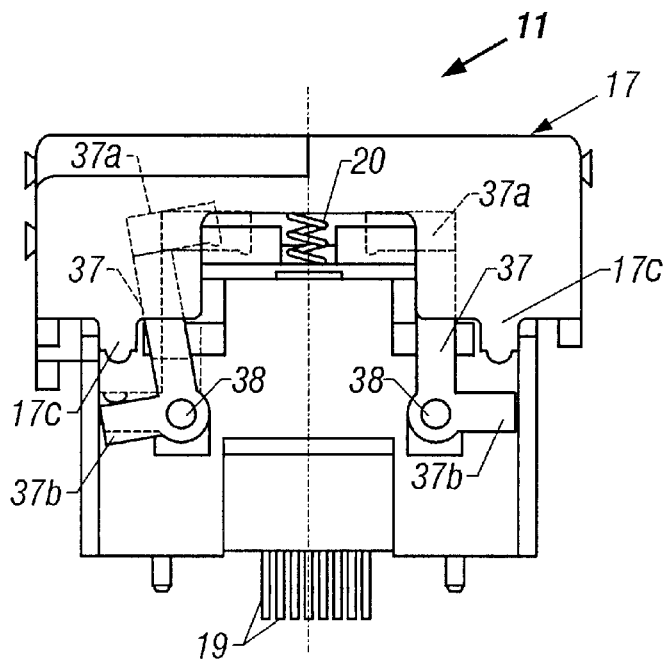
FIG. 5
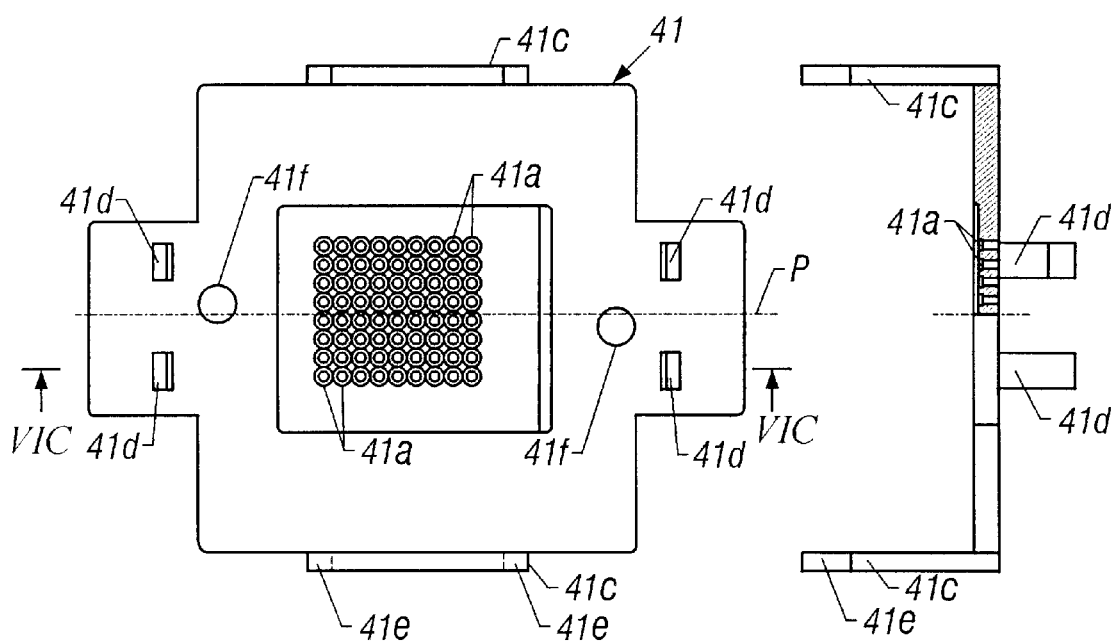
FIG. 6A  FIG. 6B

METHOD OF ASSEMBLING AN IC SOCKET FOR INTERCONNECTING ARTICLES WITH DIFFERENT TERMINAL PITCHES

BACKGROUND OF THE INVENTION

The present invention relates to an IC socket adapted to electrically connect an IC package to a printed board and also relates to a method of assembling the IC socket.

Such IC package is so called, in the known art, a ball grid array (BGA), which has a structure in which a number of spherical terminals are arranged in a grid (lattice) form to a lower surface of a rectangular package body so as to project outward therefrom.

An IC socket generally has a socket body, a mount portion formed to the socket body, on which the IC package is mounted, and a number of contact pins disposed to be elastically deformable so as to contact or separate from the terminals of the IC package.

The contact pins are press-fitted into insertion holes formed to the socket body and fixed thereto, these portion being called fixed portions, and on the upper side of the fixed portions, contact portions as elastically deformable "one end portions" are formed so as to contact or separate from the terminals of the IC package. Lower end portions as "other end portions" projecting downward from the fixed portions are inserted into through holes of the printed board and then soldered and fixed to the printed board.

An upper operation member is provided to the socket body to be vertically movable, and when the upper operation member is moved downward, a movable plate, which is provided to the socket body to be slidable in a horizontal direction, is slid. When the movable plate is slid, the contact pins are pressed by the movable plate and the contact portions thereof are elastically deformed, and at this time, the contact pins are retracted from a terminal insertion range. On the other hand, when the upper operation member is moved upward, the movable plate returns and the contact pins come back their positions due to their elastically deformable property so as to contact the terminals of the IC package.

In the conventional IC socket of the structure mentioned above, however, recently, it is required to reduce a distance between the respective terminals of the IC package, and hence, it becomes difficult to manufacture a printed board so as to accord with such reduced distance of the terminals. That is, because it is necessary for the printed board to form wirings between the respective though holes, in the arrangement in which the distances between the respective through holes in the lattice arrangement are made small, it is difficult to arrange the wirings of the number corresponding to the number of the terminals between the respective terminals.

SUMMARY OF THE INVENTION

An object of the present invention is to substantially eliminate defects or drawbacks encountered in the prior art and to provide an IC socket capable of electrically connecting an IC package and a printed board even if terminals of the IC package are arranged with reduced distances from each other and also provide a method of manufacturing such IC socket.

This and other objects can be achieved according to the present invention by providing, in one aspect, an IC socket adapted to establish an electrical connection between an IC package and a printed board, comprising:

a socket body having a mount portion on which the IC package is mounted;

a number of contact pins disposed on the socket body in substantially equally adjacent arrangement, each of the contact pins having one end to be connected to a terminal of the IC package and another end to be connected to the printed board; and means provided for the socket body for widening an interval between the another ends of adjacent contact pins so as to provide a predetermined distance therebetween.

In preferred embodiments, the interval widening means comprises a converter unit arranged with a predetermined interval from the socket body and the converter unit is formed with through holes which are arranged at a predetermined intervals therebetween and into which the contact pins are inserted and is provided with guide means for guiding the contact pins projecting from the socket body toward the through holes while widening intervals between the other ends of the contact pins.

The guide means is composed of guide projections integrally formed to the converter unit so as to project toward the socket body. The converter unit is composed of a first converter member and a second converter member opposing to the first converter member, and the guide means is formed to the second converter means, the first converter member being formed with insertion holes through which the contact pins are inserted and extend therefrom toward the through holes formed to the guide means.

The insertion holes formed to the first converter member correspond to the through holes of the second converter member in lattice arrangement and a distance between adjacent through holes of the second converter member is wider than a distance between adjacent insertion holes of the first converter member. Each of the guide projections has a projecting end portion having an inclination so as to make wide the interval between the adjacent contact pins at a time when the contact pins are inserted into the through holes of the second converter member. The guide means comprises a plurality of rod members disposed between the contact pins, respectively, so as to be inserted thereinto and withdrawn therefrom. The converter unit is composed of a first converter member and a second converter member opposing to the first converter member, the first converter member is formed with insertion holes through which the contact pins are inserted, and the second converter member is formed with through holes, the rod members being inserted between the first and second converter members.

The socket body is formed with a plurality of insertion holes through which the contact pins are inserted, each of the insertion holes having an inclination along an inserting direction of the contact pin at the one end of the contact pin so as to make wide an interval between another ends of adjacent contact pins.

The IC package has a plate structure having one surface on which a number of terminals are arranged in substantially lattice shape.

The other ends of the contact pins are elastically deformed so as to make wide an interval between the other ends of adjacent contact pins to a predetermined distance.

In another aspect of the present invention, there is provided a method of assembling an IC socket adapted to establish an electrical connection between an IC package and a printed board and comprising a socket body having a mount portion on which the IC package is mounted, and a number of contact pins disposed on the socket body in an adjacent arrangement, each of the contact pins having one end to be connected to a terminal of the IC package and another and to be connected to the printed board, the method comprising the steps of:

preparing means for widening a pitch interval between the another ends of adjacent contact pins to a predetermined distance therebetween, said widening means being provided with a guide means;

moving the widening means to the socket body so that the contact pins are guided along the guide means while widening an interval between the adjacent contact pins; and mounting the widening means to the socket body in a state of the interval of the adjacent contact pins being widened.

In a preferred embodiment, the widening means is a converter unit formed with through holes into which the contact pins are inserted and guided so as to widen the interval between the adjacent contact pins to a predetermined distance.

According to the present invention of the structures and characters mentioned above, the interval of the adjacent contact pins to be connected to the printed board is widened to a predetermined distance by the suitable interval widening means, so that even in a case of a small interval between the adjacent terminals formed to the IC package, it is not necessary to prepare the printed board having the small interval corresponding to that of the terminals, thus being advantageous and economical.

Furthermore, since the other ends of the contacts pins are formed to be elastically deformable to widen the interval between the adjacent contact pins, the assembling working can be made easy and simple in comparison with a conventional technology in which contact pins are plastically deformed so as to have different angles respectively of the other ends of the contact pins. Thus, according to the present invention, the end portions of the contact pins can be deformed easily at a desired angle to widen the interval of the adjacent contact pins.

The nature and further characteristic features of the present invention will be made more clear from the following descriptions made with reference to the accompanying drawings.

BRIEF DESCRIPTION OF THE DRAWINGS

In the accompanying drawings:

FIG. 5 is a side view of the IC socket as viewed from the right side in FIG. 3;

FIGS. 6A to 6D show a first pitch converter according to the first embodiment, in which FIG. 6A is a plan view thereof, FIG. 6B is a side view as viewed from the right side of FIG. 6A, FIG. 6C is a sectional view taken along the line VIC—VIC in FIG. 6A, and FIG. 6D is a view showing an insertion hole in an enlarged scale;

FIGS. 7A to 7D show a second pitch converter according to the first embodiment, in which FIG. 7A is a plan view thereof, FIG. 7B is a side view as viewed from the right side of FIG. 7A, FIG. 7C is a sectional view taken along the line VIIC—VIIC in FIG. 7A, and FIG. 7D is a view showing a location of insertion holes;

FIGS. 11A and 11B show arrangement of a through hole formed to an upper plate, a contact pin and a solder ball in the first embodiment, in which FIG. 11A shows a state that a contacting side of the contact pin is biased and FIG. 11B shows a state that the solder ball is held by both holding pieces of the contact pin;

FIGS. 12A and 12B show arrangement of an upper plate, a movable plate, a contact pin and a solder ball in the first embodiment, in which FIG. 12A is a sectional view taken along the line XIIA—XIIA in FIG. 11A and FIG. 12B is a sectional view taken along the line XIIB—XIIB in FIG. 11B;

DESCRIPTION OF THE PREFERRED EMBODIMENTS

Figure 1:
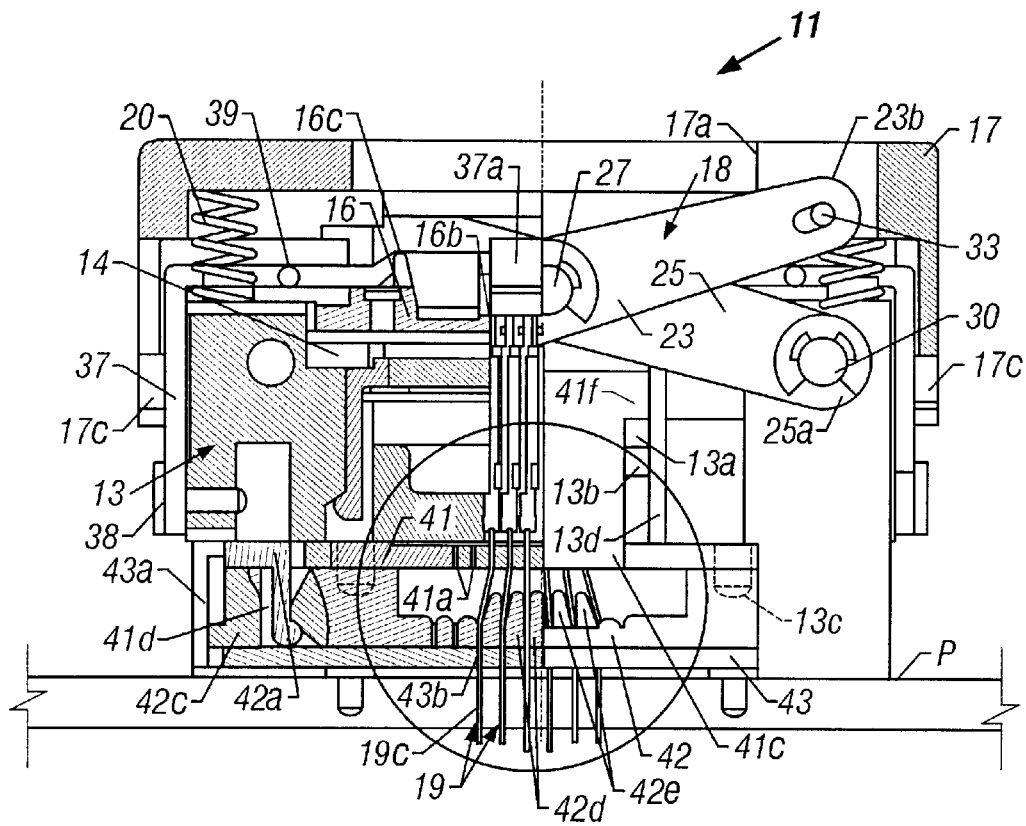
FIG. 1 is an elevational section of an IC socket according to a first embodiment of the present invention.
Figure 2:
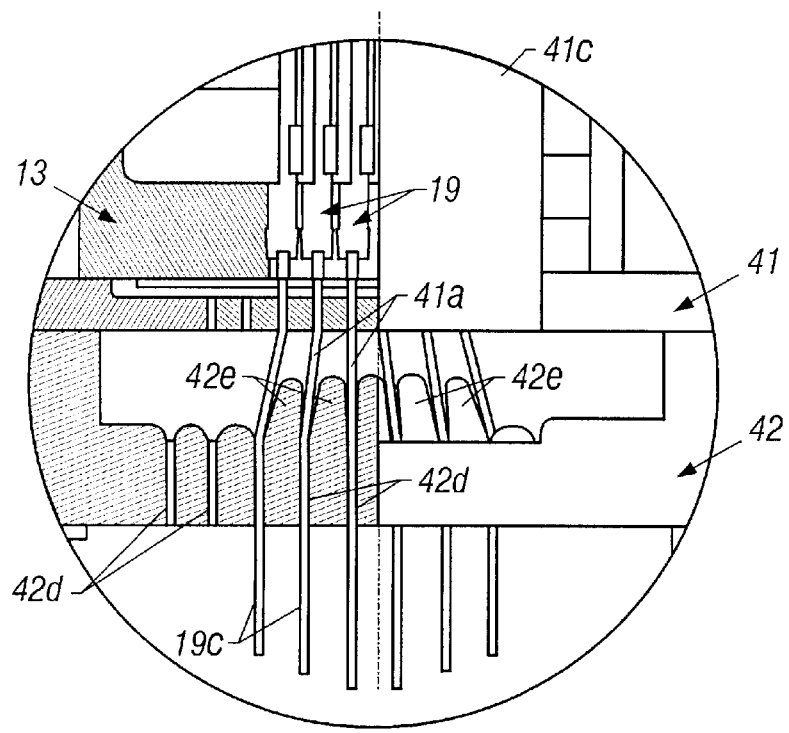
FIG. 2 is an enlarged view of an encircled portion in FIG. 1.

FIGS. 1–13 represent a first embodiment of an IC socket according to the present invention.

With reference to FIGS. 1–13, an IC socket is represented by a reference numeral 11, which is a device for electrically connecting a solder ball 12b as a terminal of an IC package 12 and a printed board P of a tester for carrying out a performance test of the IC package 12.

Figure 13A:
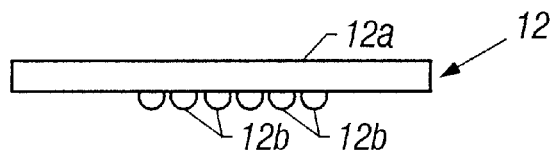
FIG. 13A is a front view of an IC package according to the first embodiment.
Figure 13B:
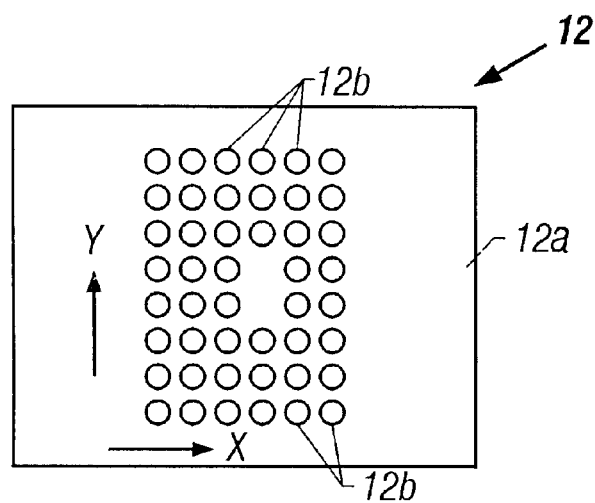
FIG. 13B is a bottom view thereof.

In the IC package 12, as shown in FIGS. 13A and 13b, a number of solder balls 12b are projected from a lower surface of a package body 12a, and these solder balls 12b are arranged in a grid shape having vertical and transverse rows Y and X with small pitches.

The IC socket 11 has a socket body 13 to be mounted on a printed board P and a rectangular movable plate 14 is disposed on the socket body 13 to be movable in a transverse direction X in a manner such that when the movable plate 14 is moved transversely, contact pins 19 mounted to the socket body 13 are elastically deformed. An upper plate 16 is secured to the socket body 13 on an upper side of the movable plate 14 in an illustrated state in FIG. 1, and an upper operation member 17, having a rectangular frame shape, is disposed further above these members to be vertically movable in a manner such that when the upper operation member 17 is vertically moved, the movable plate 14 is moved transversely through an X-shaped line 18.

Further, first and second pitch converters 41 and 42 and a location board 43 are arranged below the socket body 13 as viewed as a converter unit. These first and second pitch converters 41 and 42 are mentioned in the present specification for changing, i.e. converting a pitch interval between adjacent contact pins when the pitch converters are assembled with the socket body.

Figure 10:
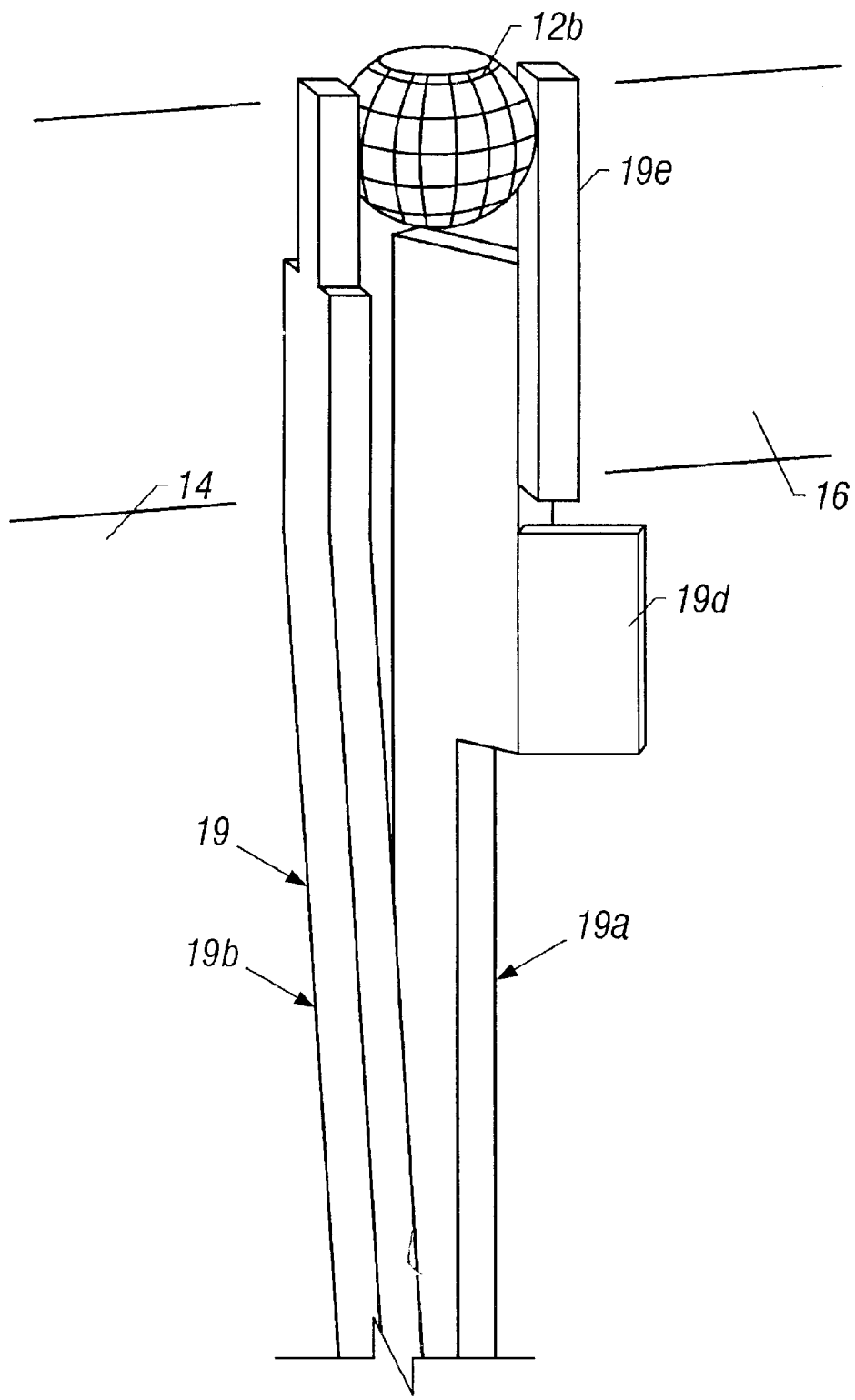
FIG. 10 is a perspective view showing an upper portion of a contact pin according to the first embodiment.

In more detail, each of the contact pins 19 has a springy property to provide an elasticity, as shown in FIG. 10, and is formed of a long plate-shape member having upper portion, as one end portion, which can be separated as forked clamping pieces 19a and 19b between which the solder ball 12b is held, i.e. clamped.

Figure 12A:
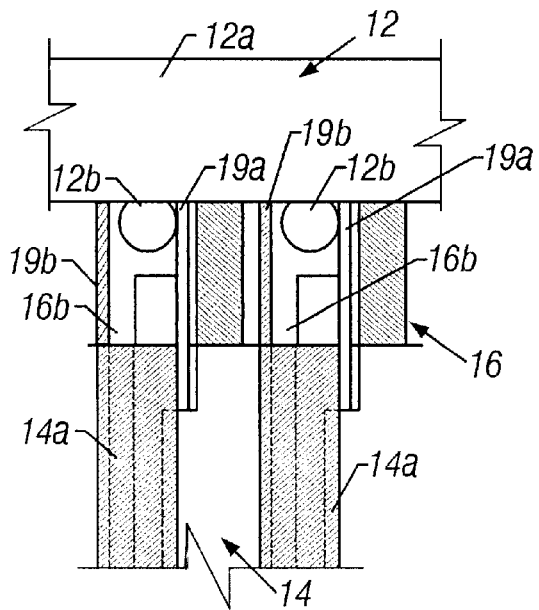
Figure 12B:
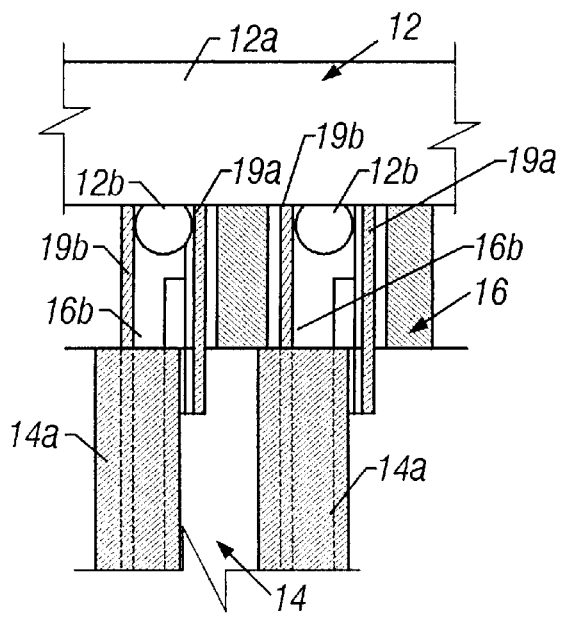

The contact pins 19, as shown in FIG. 1, for example, have lower portions inserted under pressure into the socket body 13 so that lead portions 19c, as other end portions, project downward from the lower surface of the socket body 13. The interval (distance) of the lead portions 19c are opened by the second pitch converter 42 as widening means and the lead portions 19b are then electrically connected to the printed board P. Further, the clamping pieces 19a and 19b of the contact pin 19 projecting over the upper surface of the socket body 13 penetrate the movable plate 14 and through holes 16b formed to the upper plate 16 as shown in FIGS. 12A and 12B.

One 19a of the clamping pieces of the contact pin 19 is formed with a portion 19d to be pressed (pressed portion hereunder) by the movable plate 14 as shown in FIG. 10. When this portion 19d is pressed, it is twisted and a contacting portion 19e of the clamping piece 19a is rotated from the state of FIG. 11B to the state of FIG. 11A to thereby be separated from or contact the solder ball 12b.

Further, the other one 19b of the clamping pieces of the contact pin 19 is not pressed by the movable plate 14 but contacts the solder ball 12b by the elasticity thereof. Then, both the clamping pieces 19a and 19b are contacted to the solder ball 12b at both sides thereof to held it therebetween so that the clamping pieces 19a and 19b of the contact pins 19 are arranged in directions having inclination of 45° with respect to the vertical and transverse directions Y and X of the arrangement of the solder balls 12b. Accordingly, the contact pins 19 are set so that, when the movable plate 14 is moved along the X direction, the contacting portions 19e of the clamping pieces 19a of the respective contact pins 19 move obliquely with respect to the moving direction of the movable plate 14.

Further, the upper plate 16 has a rectangular shape having four corner portions at which are formed recessed portions into which positioning bosses, not shown, projecting from the socket body 13 are fitted and is disposed above the movable plate 14 in a state being secured to the socket body 13. The movable plate 14 is formed with portions into which the positioning bosses can be idly inserted as idle insertion portions, and the idle insertion portion has a size allowing the movable plate 14 to be transversely moved without being interfered with the positioning bosses when moved transversely.

Figure 11A:
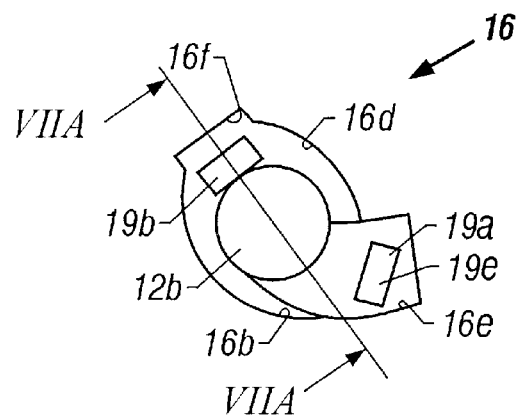
Figure 11B:
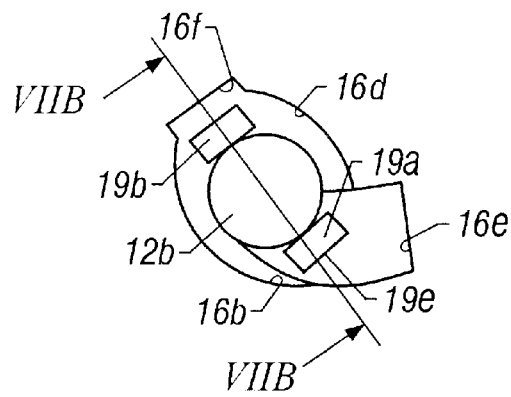

As shown in FIGS. 11A and 11B, a number of through holes 16b into which the solder balls 12b of the IC package 12 are inserted are formed to the upper plate 16 so as to provide an arrangement of the vertical row Y and transverse row X. The through hole 16b is composed of a circular portion 16d into which the solder ball 12b is inserted, a first cutout portion 16e into which the one clamping piece 19a is inserted so as to allow it to be displaced and a second cutout portion 16f into which the other one clamping piece 19b is inserted so as to allow it to be displaced. The circular portion 16d has a size slightly larger than that of the solder ball 12b. Further, as shown in FIG. 4, for example, guide portions 16c for positioning the IC package 12, when mounted, are disposed at four corner portions of the IC package 12 so as to project therefrom.

Figure 4:
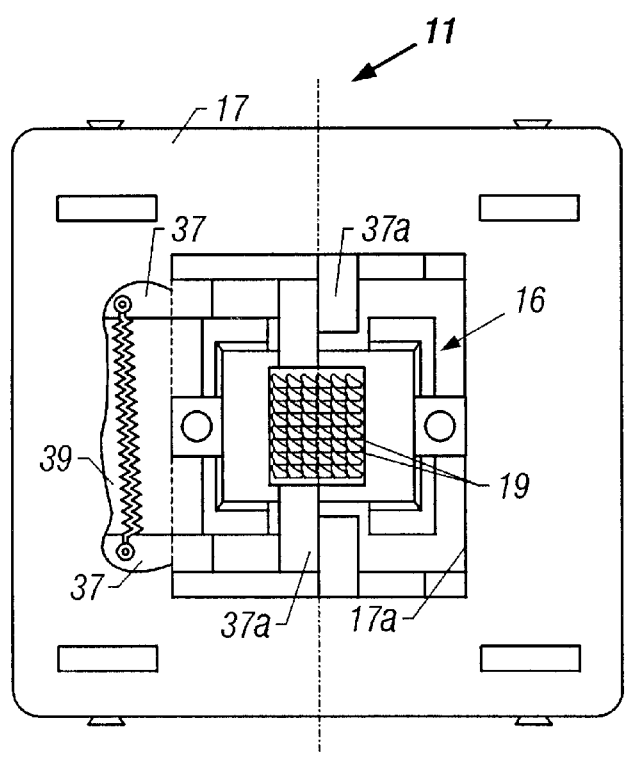
FIG. 4 is a plan view of the IC socket of the first embodiment.
Figure 6C:
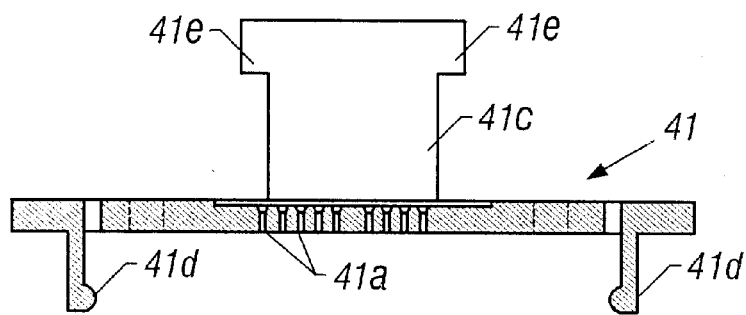
Figure 6D:
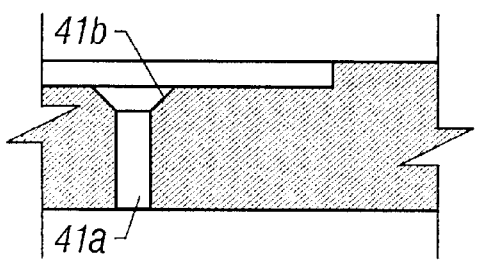
Figure 7A:
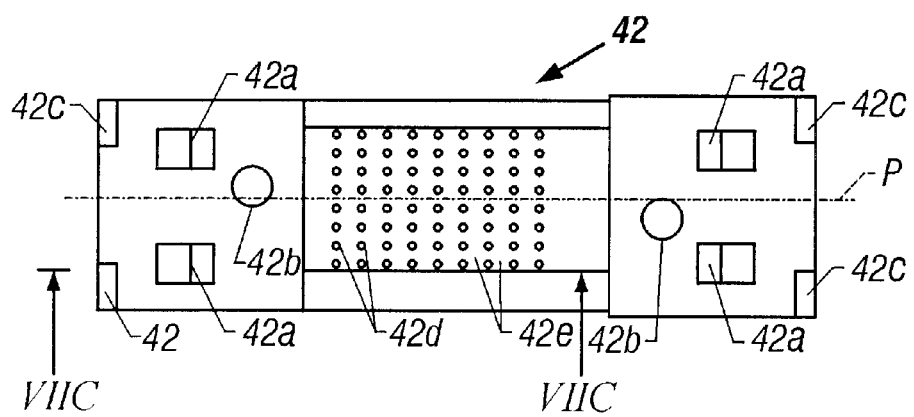
Figure 7B:
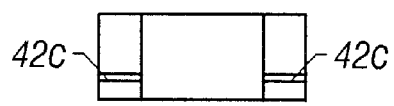
Figure 7C:
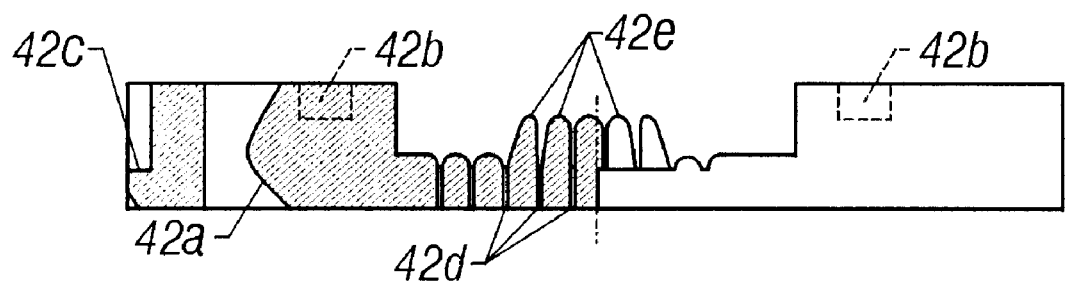
Figure 7D:
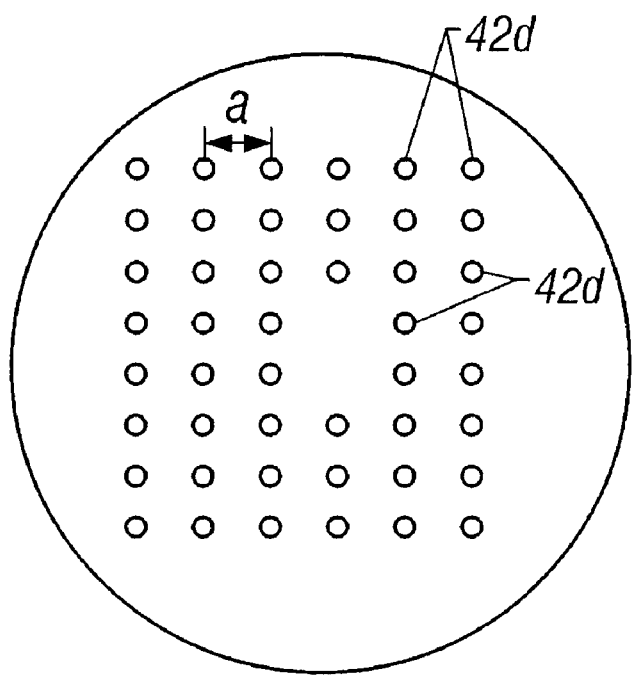

The upper operation member 17 provides, as shown in FIG. 4, a rectangular frame structure having an opening 17a having a size allowing the IC package 12 to be inserted, and the IC package 12 is inserted through the opening 17a so as to be mounted on the upper plate 16. The upper operation member 17 is disposed to the socket body 13 to be vertically movable with respect thereto, and as shown in FIG. 1, the upper operation member 17 is urged upward by means of spring 20 disposed between it and the socket body 13.

The X-shaped link member 18 is disposed to each side surface along the transverse movement of the rectangular movable plate 14 so as to form a toggle joint. That is, the X-shaped link 18 is composed of a first and second link members 23 and 25 having the same length and being connected together through a central connection pin 27 to be pivotal.

With reference to FIG. 1, for example, the first link member 23 has a lower end portion 23a pivotally connected to the socket body 13 by means of lower end connection pin 29, and on the other hand, the second link member 25 has a lower end portion 25a pivotally connected to the side surface portion, along the moving direction, of the movable plate 14 by means of lower end connection pin 30. Upper end portions 23b and 25b of these first and second link members 23 and 25 are also pivotally connected to the upper operation member 17 by means of upper end connection pins 33 and 34, respectively. The upper end portion 23b of the first link member 23 is formed with a slot through which the upper connection pin 33 is fitted so that the first link member 23 is connected to the upper operation member 17.

Furthermore, with reference to FIG. 5, a bilateral pair of latches 37 are disposed to the socket body to portions capable of being engaged with side edge portions of the IC package 12 set to the predetermined position. The latches 37 are disposed to be pivotal by a shaft 38 such as pin to the socket body 13 so as to provide a crank structure, as viewed from the side of FIG. 5, having engaging portions 37a at the upper end thereof to be engageable with the side edge portion of the IC package 12 and having lower end portions 37b to be pressed so as to extend sideways from the shafts 38. When the upper operation member 17 moves downward, the lower end portions 37b are pressed downward by pressing portions 17c of the upper operation member 17 to thereby rotate the latches 37 to be retired from the engaging position of the IC package 12. On the contrary, when the upper operation member 17 moves upward, as shown in FIG. 4, both the latches 37 are pivoted in a standing direction thereof by means of spring 39 disposed so as to couple both the upper end portions of the respective latches 37, thus achieving the engagement of the engaging portions 37a of the latches 37 with the IC package 12.

With reference to FIGS. 6A to 6D, the first pitch converter 41 has substantially a plate shape and is formed with a number of insertion holes 41a into which a number of contact pins 19 projecting downward from the socket body 13 are inserted (penetrate when assembled). The insertion holes 41a have upper tapered portions 41b allowing the contact pins 19 to be easily inserted thereinto. The first pitch converter 41 is further formed with a pair of upper side engaging pieces 41c extending upward from both side edge portions thereof, the upper side engaging pieces 41c being engaged with the socket body 13, and also formed with four lower side engaging pieces 41d extending downward so as to be engaged with the second pitch converter 42.

The upper end portion of the upper side engaging piece 41c has side projections as engaging projections 41e, which are engaged, as shown in FIG. 1, with the upper side of the engaging projection 13a projecting from the side surface of the socket body 13. According to such structure, the first pitch converter 41 can be mounted to the socket body 13. The socket body 13 is formed with a tapered surface 13b at a lower side portion of the engaging projection 13a, so that, when the first pitch converter 41 is mounted from the lower side to the socket body 13, the engaging projection 41e slides on the tapered surface 13b and the upper side engaging piece 41c is elastically deformed, whereby the engaging projection 41e can get over the engaging projection 13a. Furthermore, as shown in FIG. 8, a pair of positioning holes 41f, into which the positioning bosses 13c projecting downward from the lower surface of the socket body 13 are fitted, are formed to the first pitch converter 41 at portions offset from the center line P as shown in FIG. 6.

The second pitch converter 42 is formed with, as shown in FIGS. 7A to 7D, an engagement portion 42a having substantially "<"-shape with which the lower side engaging piece 41d of the first pitch converter 41 is engaged, a positioning recessed portion 42b into which the positioning boss 13c is fitted and an engaging hook 42c which is formed on the side edge portion of the second pitch converter 42 and with which a location board 43 is engaged. The second pitch converter 42 is also formed, at the central portion thereof, with a number of through holes 42d into which the contact pins 19 are to be inserted and which are separated with constant distance from the first pitch converter 41. The distance, i.e. interval, between the adjacent through holes 42d, is designed such that the pitch a (interval) in the bilateral direction in FIG. 7D has a width wider than the interval of the insertion holes 41a of the first pitch converter 41. The second pitch converter 42 is further integrally provided with guide projections 42e as guide means for guiding the lower end portions of the contact pins 19 projecting from the first pitch converter 41 towards the through holes 42d, respectively, while the lower end portions being widened during the guiding.

Figure 8:
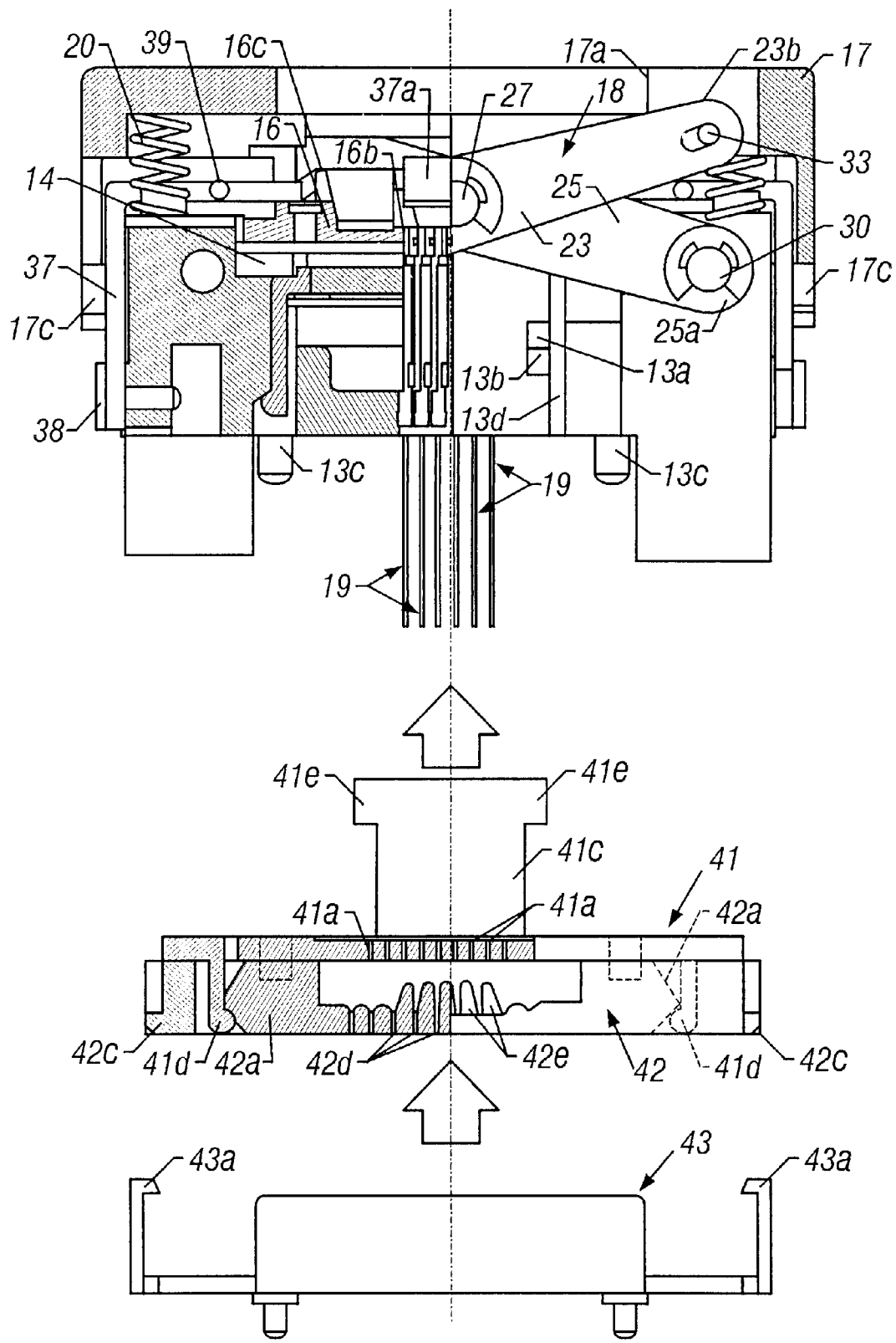
FIG. 8 is a developed view for explaining an assembling process of the IC socket of the first embodiment.
Figure 9:
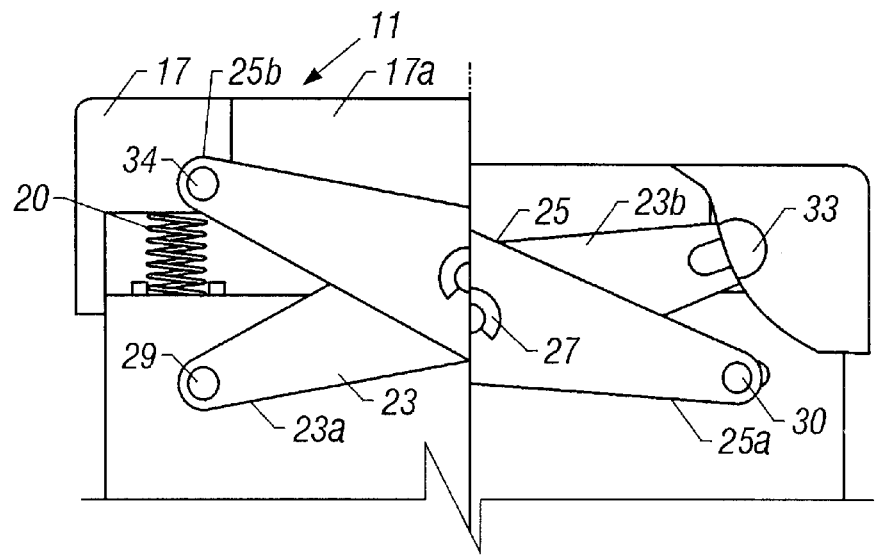
FIG. 9 is a view showing an arrangement of an X-shaped link of the IC socket according to the first embodiment.

Furthermore, the location board 43, as shown in FIG. 8, is formed with a pair of hook pieces 43a projecting upward from both side edge portions thereof, and the hook pieces 43a are engaged with the engaging hooks 42c of the second pitch converter 42.

The IC socket 11 of the structure mentioned above will be assembled in the following manner particularly with reference to the first and second pitch converters 41 and 42 and the location board 43.

First, referring to FIG. 8, the lower side engaging piece 41d of the first pitch converter 41 is engaged with the engagement portion 42a of the second pitch converter 42 to thereby assemble both the first and second pitch converters 41 and 42 together.

Then, the first and second pitch converters 41 and 42 are mounted to the socket body 13 from the lower side as viewed, for example, in FIG. 1. In this mounting operation, the upper side engaging piece 41c of the first pitch converter 41 is moved, in parallel, upward while being guided by the projected guide member 13d formed on the side surface of the socket body 13.

According to such assembling operation, the lower end sides of the contact pins 19 are first inserted into the insertion holes 41a of the first pitch converter 41, and in this insertion, since the upper portions 41b of the insertion holes 41a are formed as tapered surfaces, the lower end sides of the contact pins 19 can be surely guided into the insertion holes 41a even if the lower end sides thereof be slightly deformed.

In the next step, the contact pins 19 projecting downward over the lower surface of the first pitch converter 41 contact the guide projections 42e of the second pitch converter 42 and are then guided along the inclined surfaces of the guide projections 42e toward the through holes 42d while being widened in their intervals (distances).

When the positioning bosses 13c of the socket body 13 are fitted into the positioning holes 41f of the first pitch converter 41 and the positioning recessed portions 42b of the second converter 42, and then, the engagement projection 41e of the upper side engaging piece 41c of the first pitch converter 41 is engaged with the engagement projection 13a of the socket body 13, thereby mounting both the pitch converters 41 and 42 to the socket body 13.

Figure 3:
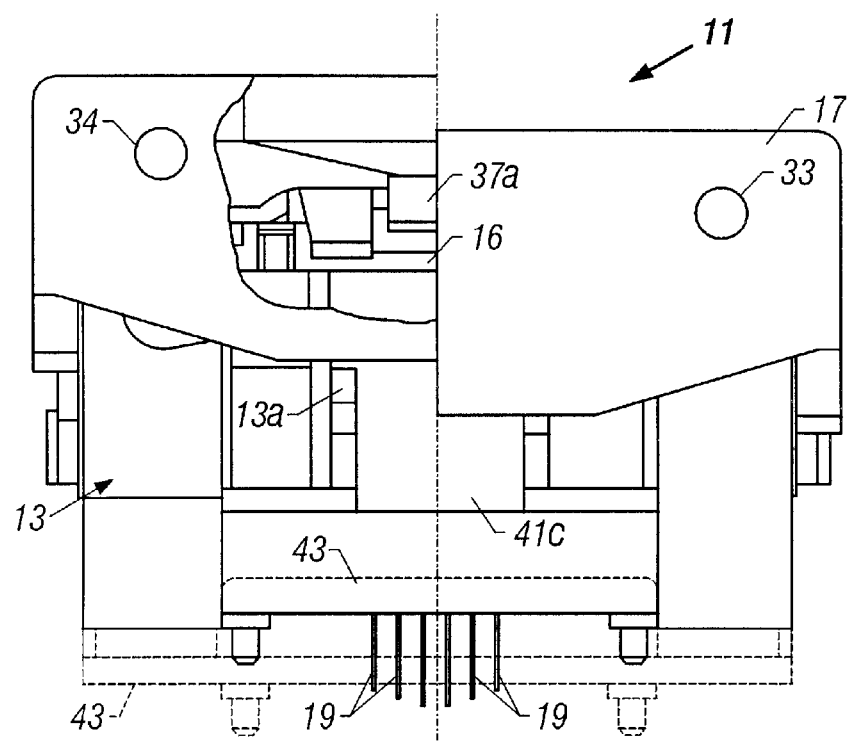
FIG. 3 is a front view of the IC socket of the first embodiment.

According to the manner mentioned above, the widened lower end sides of the contact pins 19 are inserted into the insertion holes 43b of the location board 43, which is arranged to be vertically movable with respect to the socket body 13, and as shown by a broken line in FIG. 3, at the most lowered position of the location board 43, the lower ends of the contact pins 19 slightly project downward therefrom. Under the state, since the respective contact pins 19 are positioned to the predetermined positions, the lower ends thereof can be surely positioned (inserted into the insertion holes) to the predetermined positions of the printed board P by locating the contact pins 19 as they are on the printed board P.

From the state mentioned above, when the socket body 13 is further lowered, the location board 43 approaches the socket body side and abuts against the second pitch converter 42, whereby the lower ends of the contact pins 19 can be completely inserted into the insertion holes of the printed board P. Thereafter, the contact pins 19 are soldered to the printed board P, thus completing the assembling (mounting) operation.

According to the manner mentioned above in which the distance (pitch) between the contact pins 19 is widened on the connection side of the printed board P, the distance of the connection portion, i.e. distance between the through holes, of the printed board P can be widened. As a result, a number of wirings can pass between the contact pin through holes of the printed board P, and accordingly, even if the interval between the solder balls 12b is reduced, it is not necessary to also reduce the distance between the through holes of the printed board P, thus easily preparing the printed board P.

The IC socket 11 of the characters mentioned above will be used in the following manner.

First, a plurality of IC sockets 11 are arranged on the printed board P by preliminarily inserting the contact pins 19 of the IC sockets 11 into the through holes of the printed board P and soldered thereto in accordance with the manner mentioned above.

Then, the IC packages 12 are set to the IC sockets 13 by, for example, an automatic machine, in the following manner, thereby to establish an electrical connection therebetween.

That is, under the IC package 12 being maintained as it is, the upper operation member 17 is depressed and lowered against the urging force of the spring 20 by the automatic machine, and then, the latches 37 are rotated against the force of the spring 39 by the pressing portions 17c of the upper operation member 17 and the latches 37 are retired from the IC package insertion area.

At the same time, the movable plate 14 is transversely moved by means of the X-shaped link 18, and according to such transverse movement of the movable plate 14, the portion 19d to be pressed of the clamping piece 19a of the contact pin 19 is pressed and then twisted by the pressing portion 14a of the movable plate 14, and hence, the contacting portion 19e is rotated and deformed. Under this state, when the IC package 12 is released from the automatic machine, the solder balls 12b of the IC package 12 are inserted into the through holes 16b of the upper plate 16.

In the operation mentioned above, when the upper operation member 17 is lowered, the upper end portions 23b and 25b of the link members 23 and 25 of the X-shaped link 18 depressed and lowered, and then rotated, so that the lower end 25a of the second link member 25 is moved transversely. According to this motion, the movable plate 14 moves transversely in the right direction, as viewed in FIGS. 12A and 12B.

Thereafter, when the depressing force of the upper operation member due to the automatic machine is released, the upper operation member 17 is moved upward by the urging force of the spring 20 and the movable plate 14 is returned to its original position. Accordingly, one clamping piece 19a of the contact pin 19 is returned by its elasticity, and the contacting portion 19e of the clamping piece 19a contacts the solder ball 12b of the IC package 12. In this state, since the other clamping piece 19b also contacts the solder ball 12b, so that the solder ball 12b is hold between the clamping pieces 19a and 19b, thus establishing an electrical connection. At this moment, when the upper operation member 17 is moved upward, the latches 37 are rotated by the urging force of the spring 39 and engaged with the side portions of the IC package 12, thereby firmly holding the IC package 12.

Figure 14:
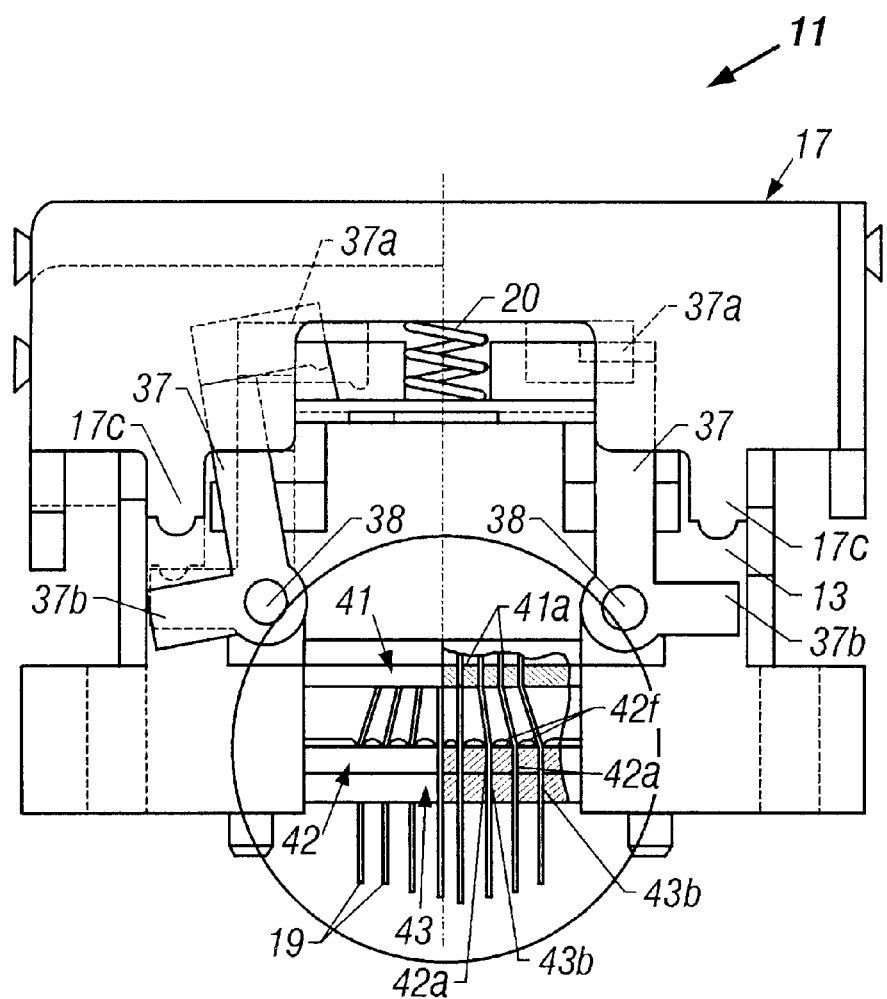
FIG. 14 is a sectional view, similar to FIG. 5 but partially omitted, of an IC socket according to a second embodiment of the present invention.
Figure 15:
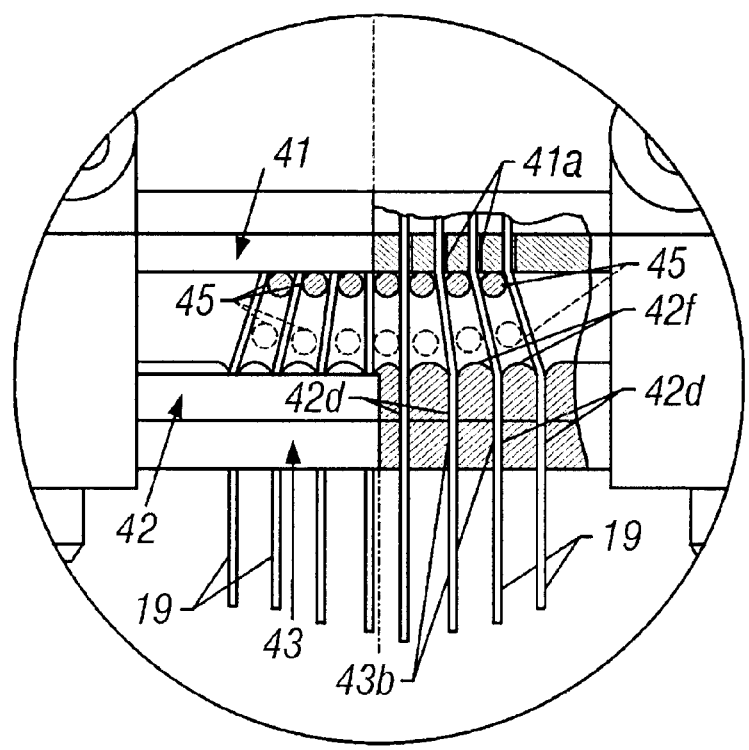
FIG. 15 is an enlarged view of a portion encircled in FIG. 14 showing a state that a rod member is inserted, according to the second embodiment.

A second embodiment of the present invention will be described hereunder with reference to FIGS. 14 and 15.

Although, in the first embodiment, the guide projection 42e as guide means is integrally formed with the second pitch converter 42, in this second embodiment, a plurality of rod-shaped members 45 as guide means are located between the first and second pitch converters 41 and 42 to be capable of being inserted and withdrawn. Further, in addition, the second pitch converter 42 is not provided with the guide projection 42e, but provided with a circular arc portion 42f for the easily insertion of the contact pin 19 into the through hole 42d.

In the assembling method using such rod members 45, the lower end portions of the respective contact pins 19 are inserted into the insertion holes 41a, respectively, of the first pitch converter 41 so that the distal ends thereof project downward, and in a state before the insertion thereof into the through holes 42d of the second pitch converter 42, the rod members 45 are put into portions between the respective contact pins 19. The putting positions are near the second pitch converter side as shown by two-dot and dash lines in FIG. 15, and in the inserted state, the rod members 45 are held by the contact pins 19 by the elasticity thereof. From the state mentioned above, the respective pins 19 are moved upward to adjust the positions thereof, thus adjusting the intervals, i.e. distances, between the respective contact pins 19.

Thereafter, the lower end portions of the respective contact pins 19 which are adjusted in their positions are inserted into the through holes 42d of the second pitch converter 42, thus mounting the first and second pitch converters 41 and 42 to the socket body 13.

Then, the rod members 45 are removed sideways because they are not needed thereafter.

The other structure and function or operation of the second embodiment are substantially the same as those of the first embodiment, so that the details thereof are omitted herein.

Further, in this second embodiment, although a plurality of rod members 45, respectively independent, are used, a comb-shaped member may be instead used, or a jig member may be arranged on both sides of the rod members 45 for vertically parallelly moving the rod members 45.

Figure 16:
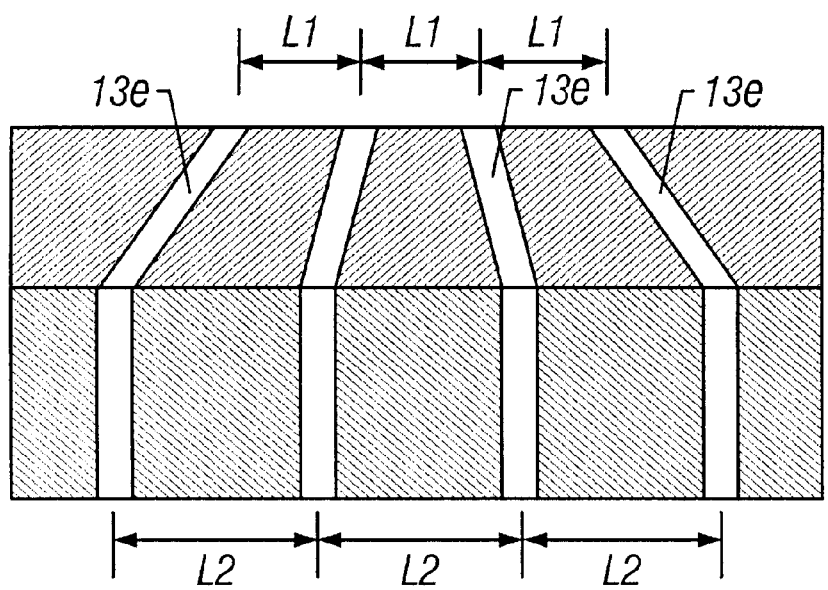
FIG. 16 is an illustrated view showing a formation of an insertion hole into which a contact pin is inserted, according to a third embodiment of the present invention.

FIG. 16 represents a third embodiment of the present invention.

Although in the first embodiment, the guide projection 42e as guide means in integrally formed with the second pitch converter 42, in this third embodiment, the socket body 13 is formed with insertion holes 13e into which the contact pins 19 are inserted, and these insertion holes 13e are formed so as to have intervals L1 on the upper side end portions and L2 on the lower side end portions so that the interval L2 is larger than the interval L1 (L2>L1), and so as to be substantially in parallel to each other with this interval L2 being maintained.

The other structure and function or operation of the third embodiment are substantially the same as those of the first or second embodiment, so that the details thereof are omitted herein.

According to the present invention, the following modification may be adopted without being limited to the embodiments described hereinabove.

In the described embodiments, the terminals of the IC package are composed of spherical solder balls 12b, but rod-shaped members may be instead utilized.

In the described embodiments, the respective contact pins 19 project upward, as viewed, from the socket body 13 and contact the solder balls 12b provided to the lower surface of the IC package 12. In a modification, however, this invention can be applied to an IC socket in which contact pins contact terminals from the upper side thereof so as to be applicable to an IC package having terminals disposed on the peripheral edge portion thereof.

Furthermore, in the described embodiments, the contact pins 19 are press-fitted from the upper side with respect to the socket body 13, but in a modification, the contact pins may be press-fitted from the lower side with respect thereto. In such modification, when the other end portions of the contact pins are widened by applying load from the lower side, this load can be effectively received to the contact pins, so that the distance between the other end portions of the contact pins are more surely widened.

At any rate, it is to be noted that the present invention is not limited to the described embodiment and modifications and many other changes or further modification may be made without departing from the scopes of the appended claims.

What is claimed is:

1. A method of assembling an IC socket adapted to establish an electrical connection between an IC package and a printed board and comprising a socket body having a mount portion on which the IC package is mounted, and a plurality of contact pins disposed on the socket body in an adjacent arrangement, each of said contact pins having a first end to be connected to a terminal of the IC package and a second end to be connected to the printed board, said method comprising the steps of:

providing means for widening a pitch interval between the second ends of adjacent contact pins to a predetermined distance therebetween, said means for widening being provided with a guide means for guiding the contact pins;

moving the means for widening to the socket body so that the contact pins are guided along the guide means while widening an interval between the second ends of the adjacent contact pins; and mounting the means for widening to the socket body in a state of the interval of the adjacent contact pins being widened.

2. The method of assembling an IC socket according to claim 1, wherein said means for widening is a converter unit formed with through holes into which the contact pins are inserted and guided so as to widen the pitch interval between the second ends of the adjacent contact pins to the predetermined distance.

3. The method of assembling an IC socket according to claim 2, wherein said converter unit comprises a first converter member and a second converter member opposing said first converter member, and said guide means is formed in said second converter member, said first converter member being formed with insertion holes through which said contact pins are inserted and extend therefrom toward a plurality of through holes formed in the second converter member.

4. The method of assembling an IC socket according to claim 3, wherein said insertion holes formed to the first converter member correspond to said through holes of the second converter member which are in lattice arrangement, and wherein a distance between adjacent through holes of the second converter member is wider than a distance between adjacent insertion holes of the first converter member.

5. The method of assembling an IC socket according to claim 1, wherein said socket body is formed with a plurality of insertion holes through which said contact pins are inserted, each of said insertion holes having an inclination along an inserting direction of the contact pin at said first end of the contact pin so as to widen an interval between second ends of adjacent contact pins.

6. The method of assembling an IC socket according to claim 1, wherein said moving step has a step of elastically deforming the second ends of the contact pins so as to widen an interval between the second ends of adjacent contact pins to a predetermined distance.

* * * * *